US012230576B2

(12) United States Patent
Jung et al.

(10) Patent No.: US 12,230,576 B2
(45) Date of Patent: Feb. 18, 2025

(54) CHIP-ON-FILM PACKAGE AND DISPLAY APPARATUS INCLUDING THE SAME

(71) Applicant: Samsung Electronics Co., Ltd., Suwon-si (KR)

(72) Inventors: Jaemin Jung, Seoul (KR); Jeongkyu Ha, Hwaseong-si (KR); Sanguk Han, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 456 days.

(21) Appl. No.: 17/579,635

(22) Filed: Jan. 20, 2022

(65) Prior Publication Data
US 2022/0246530 A1 Aug. 4, 2022

(30) Foreign Application Priority Data

Feb. 4, 2021 (KR) .......................... 10-2021-0016276

(51) Int. Cl.
H01L 23/538 (2006.01)
H01L 25/18 (2023.01)
H05K 1/18 (2006.01)
H01L 23/00 (2006.01)
H01L 23/373 (2006.01)

(52) U.S. Cl.
CPC .......... *H01L 23/5385* (2013.01); *H01L 25/18* (2013.01); *H05K 1/189* (2013.01); *H01L 23/3735* (2013.01); *H01L 23/5387* (2013.01); *H01L 24/16* (2013.01); *H01L 24/32* (2013.01); *H01L 24/73* (2013.01); *H01L 2224/16225* (2013.01); *H01L 2224/32225* (2013.01); *H01L 2224/73204* (2013.01); *H05K 2201/10128* (2013.01); *H05K 2201/10136* (2013.01); *H05K 2201/10151* (2013.01); *H05K 2201/10378* (2013.01); *H05K 2201/10446* (2013.01); *H05K 2201/10522* (2013.01); *H05K 2201/1053* (2013.01)

(58) Field of Classification Search
None
See application file for complete search history.

(56) References Cited

U.S. PATENT DOCUMENTS

| 9,419,065 | B2 | 8/2016 | Degner et al. |
| 9,933,870 | B2 | 4/2018 | You et al. |
| 10,741,789 | B2* | 8/2020 | Oh ........................ H10K 77/111 |
| 10,764,973 | B2 | 9/2020 | Ikeda et al. |

(Continued)

FOREIGN PATENT DOCUMENTS

| JP | 2020067589 A | 4/2020 |
| KR | 102117265 B1 | 6/2020 |

*Primary Examiner* — Sarah K Salerno
(74) *Attorney, Agent, or Firm* — Muir Patent Law, PLLC

(57) ABSTRACT

A chip on film (COF) package includes a base film having an upper surface and a lower surface opposite to each other, a bridge film having an edge that overlaps the base film, and an upper surface and a lower surface opposite to each other, a display driver integrated circuit (IC) mounted on the upper surface of the base film, and a heat dissipation member arranged in correspondence with the display driver IC on the lower surface of the base film. The upper surface of the base film and the lower surface of the bridge film adhere to each other in their respective long axis directions, and a long axis length of the bridge film is greater than a long axis length of the base film.

18 Claims, 10 Drawing Sheets

(56) References Cited

U.S. PATENT DOCUMENTS

| | | |
|---|---|---|
| 2018/0049324 A1* | 2/2018 | Koo .................... H01L 25/0655 |
| 2020/0037442 A1 | 1/2020 | Keum et al. |
| 2020/0084890 A1 | 3/2020 | Jang et al. |
| 2020/0111978 A1 | 4/2020 | Kim et al. |

* cited by examiner

CHIP-ON-FILM PACKAGE AND DISPLAY APPARATUS INCLUDING THE SAME

CROSS-REFERENCE TO RELATED APPLICATION

This application is based on and claims priority under 35 U.S.C. § 119 to Korean Patent Application No. 10-2021-0016276, filed on Feb. 4, 2021, in the Korean Intellectual Property Office, the disclosure of which is incorporated by reference herein in its entirety.

BACKGROUND

The inventive concept relates to chip-on-film (COF) packages and display apparatuses including the same, and more particularly, to a COF package, on which a display driver integrated circuit (IC) is mounted, and a display apparatus including the COF package.

In a COF package, a semiconductor chip may be mounted on a base film, and may be electrically connected to external devices through conductive lines. As recent display apparatuses include a small bezel and a thin panel, an area where a COF package and a display panel contact each other is also reduced.

SUMMARY

The inventive concept provides a chip-on-film (COF) package capable of improving a dead space of a display panel, and a display apparatus including the COF package.

Additional aspects will be set forth in part in the description which follows and, in part, will be apparent from the description, or may be learned by practice of the presented embodiments.

According to an aspect of the inventive concept, there is provided a chip on film (COF) package including a base film having an upper surface and a lower surface opposite to each other, a bridge film having an edge that overlaps the base film, and an upper surface and a lower surface opposite to each other, a display driver integrated circuit (IC) mounted on the upper surface of the base film, and a heat dissipation member arranged in correspondence with the display driver IC on the lower surface of the base film. The upper surface of the base film and the lower surface of the bridge film adhere to each other in their respective long axis directions, and a long axis length of the bridge film is greater than a long axis length of the base film.

According to another aspect of the inventive concept, there is provided a COF package including a base film having an upper surface and a lower surface opposite to each other, and a bridge film having an edge that overlaps the base film, and an upper surface and a lower surface opposite to each other. The base film includes a first conductive line arranged on the upper surface of the base film and having a first conductive pad; a display driver IC mounted on the upper surface of the base film, a first protective layer formed on the first conductive line and the upper surface of the base film so as to expose the first conductive pad, an underfill filled between the display driver IC and the base film, and a heat dissipation member arranged in correspondence with the display driver IC on the lower surface of the base film. The bridge film includes a second conductive line arranged on the lower surface of the bridge film and including a second conductive pad, and a second protective layer formed on the second conductive line and the lower surface of the bridge film so as to expose the second conductive pad. The first conductive pad contacts the second conductive pad. A plurality of base films are spaced apart from each other and adhere to the bridge film.

According to another aspect of the inventive concept, there is provided a display apparatus including a COF package including a base film and a bridge film, a display panel to which the COF package is bent and fixed, and a driving printed circuit board that faces the display panel. The COF package includes a base film having an upper surface and a lower surface opposite to each other, a bridge film including an edge that overlaps the base film, and an upper surface and a lower surface opposite to each other, a display driver IC mounted on the upper surface of the base film, and a heat dissipation member arranged in correspondence with the display driver IC on the lower surface of the base film. The upper surface of the base film and the lower surface of the bridge film adhere to each other in their respective long axis directions, and a long axis length of the bridge film is greater than a long axis length of the base film.

BRIEF DESCRIPTION OF THE DRAWINGS

Exemplary embodiments of the inventive concept will be more clearly understood from the following detailed description taken in conjunction with the accompanying drawings in which like numerals refer to like elements throughout. In the drawings.

DETAILED DESCRIPTION OF THE EMBODIMENTS

Embodiments of the inventive concept will now be described more fully with reference to the accompanying drawings.

Figure 1:
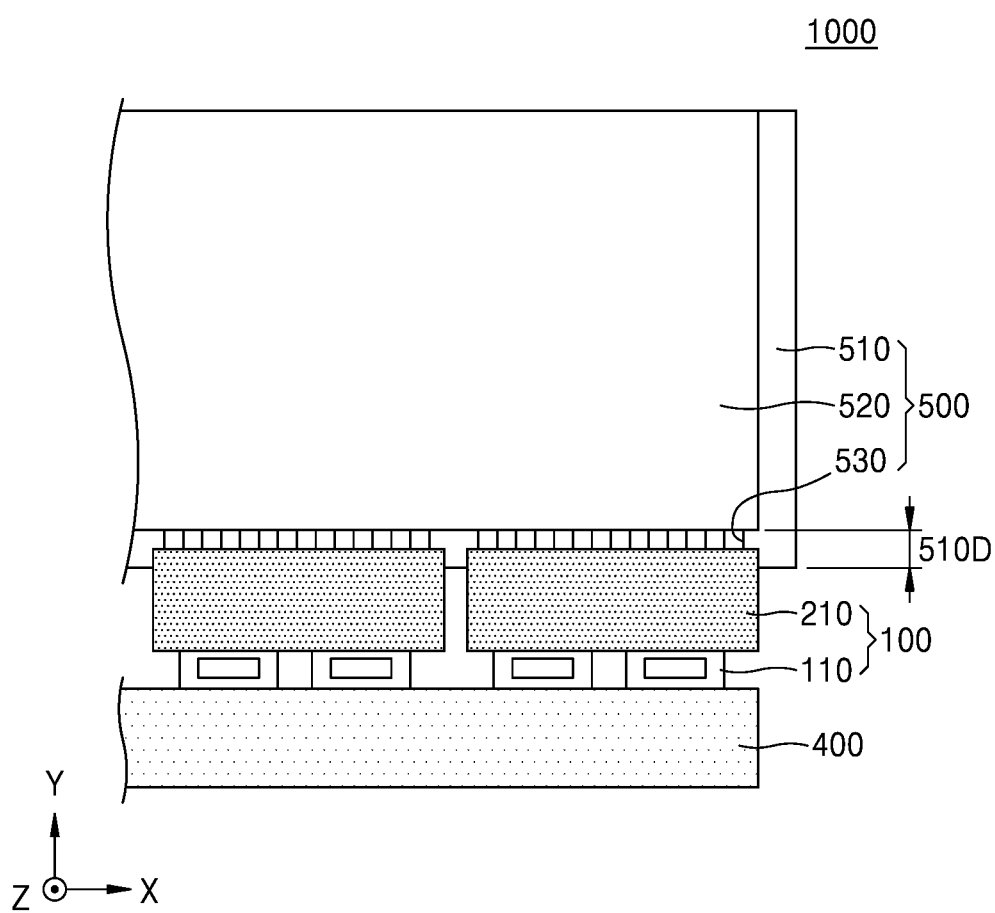
FIG. 1 is a plan view of a display apparatus, according to an example embodiment of the inventive concept.
Figure 2:
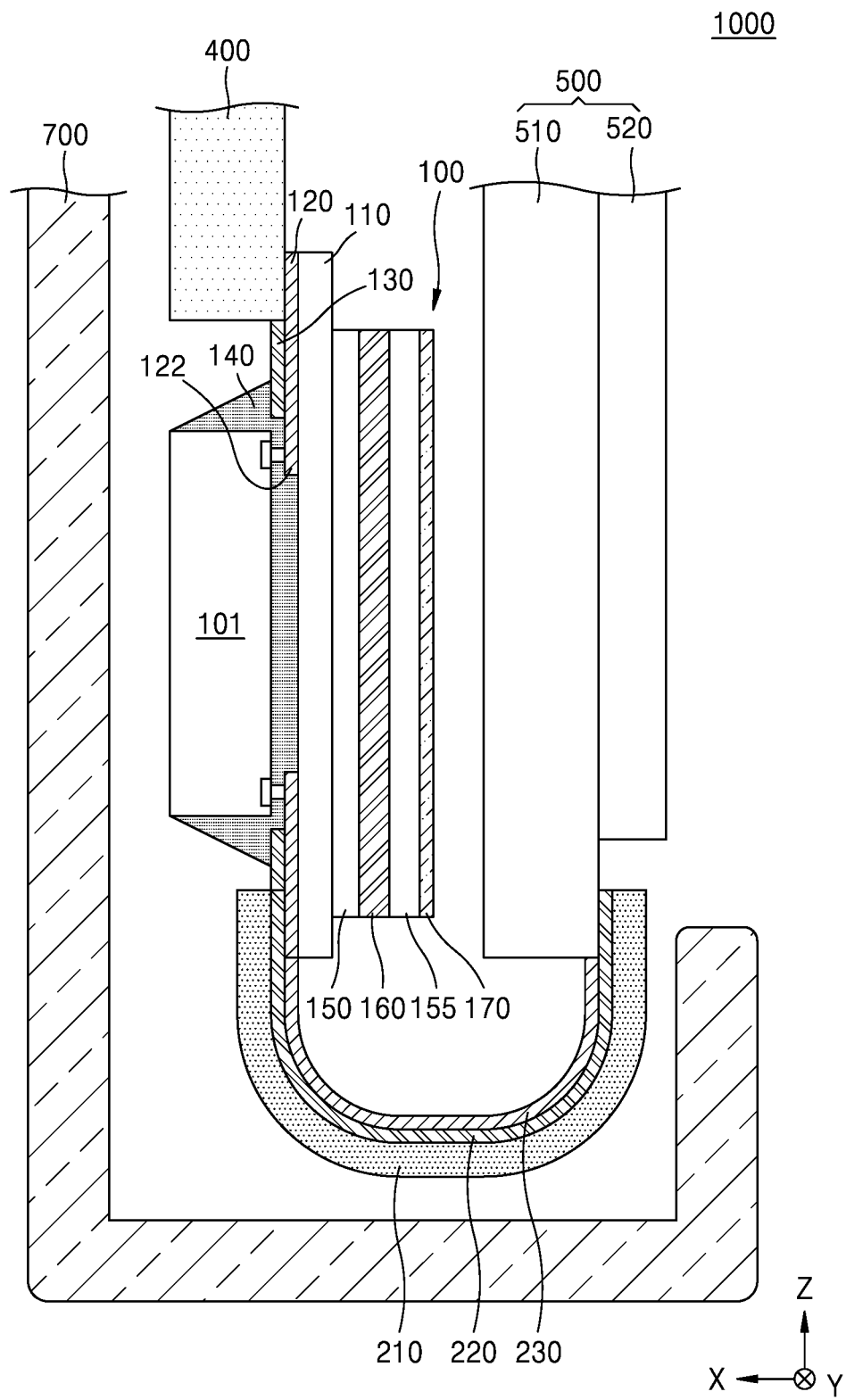
FIG. 2 is a side cross-sectional view of the display apparatus of FIG. 1.
Figure 3:
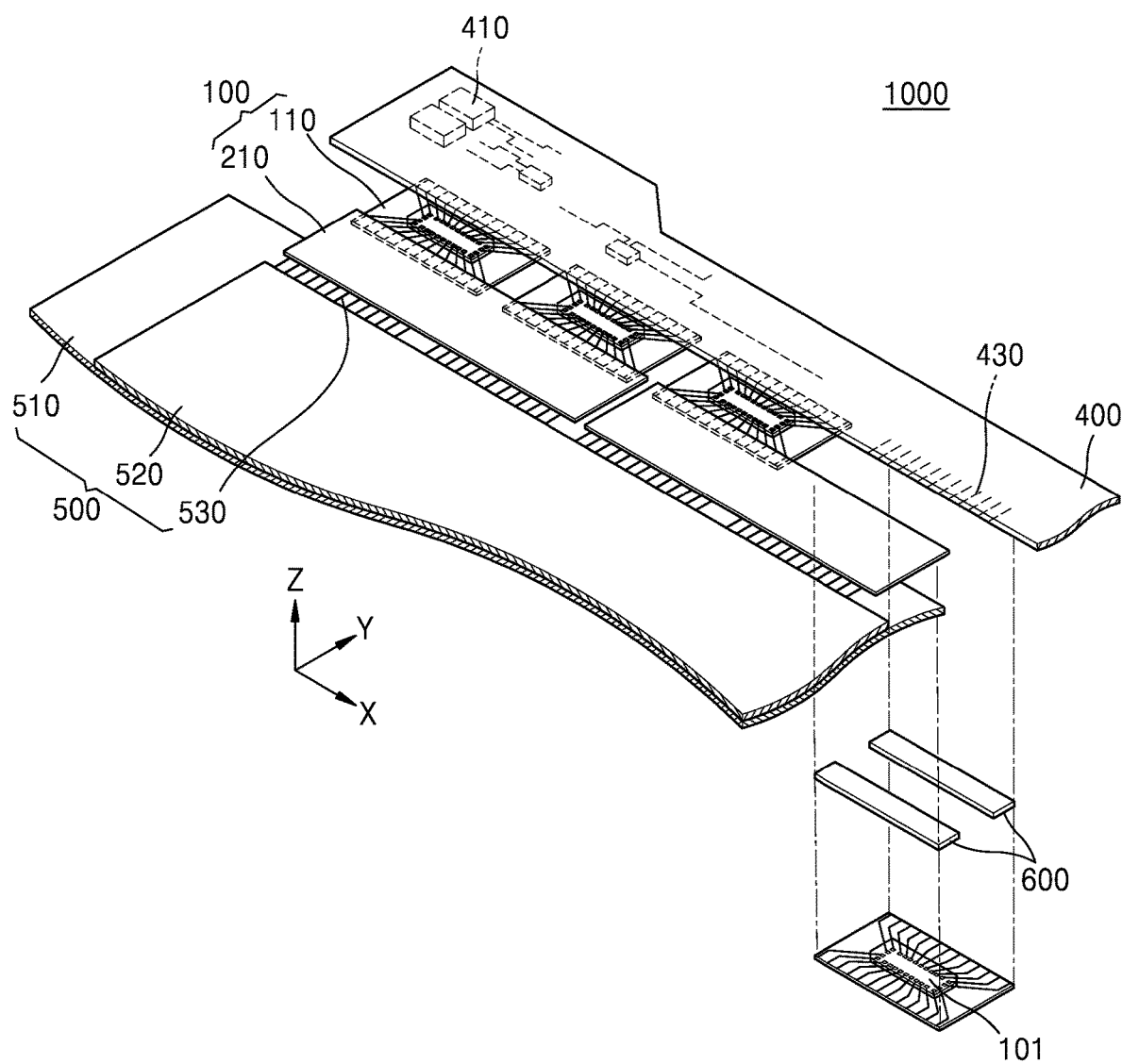
FIG. 3 is a perspective view of the display apparatus of FIG. 1.
Figure 4:
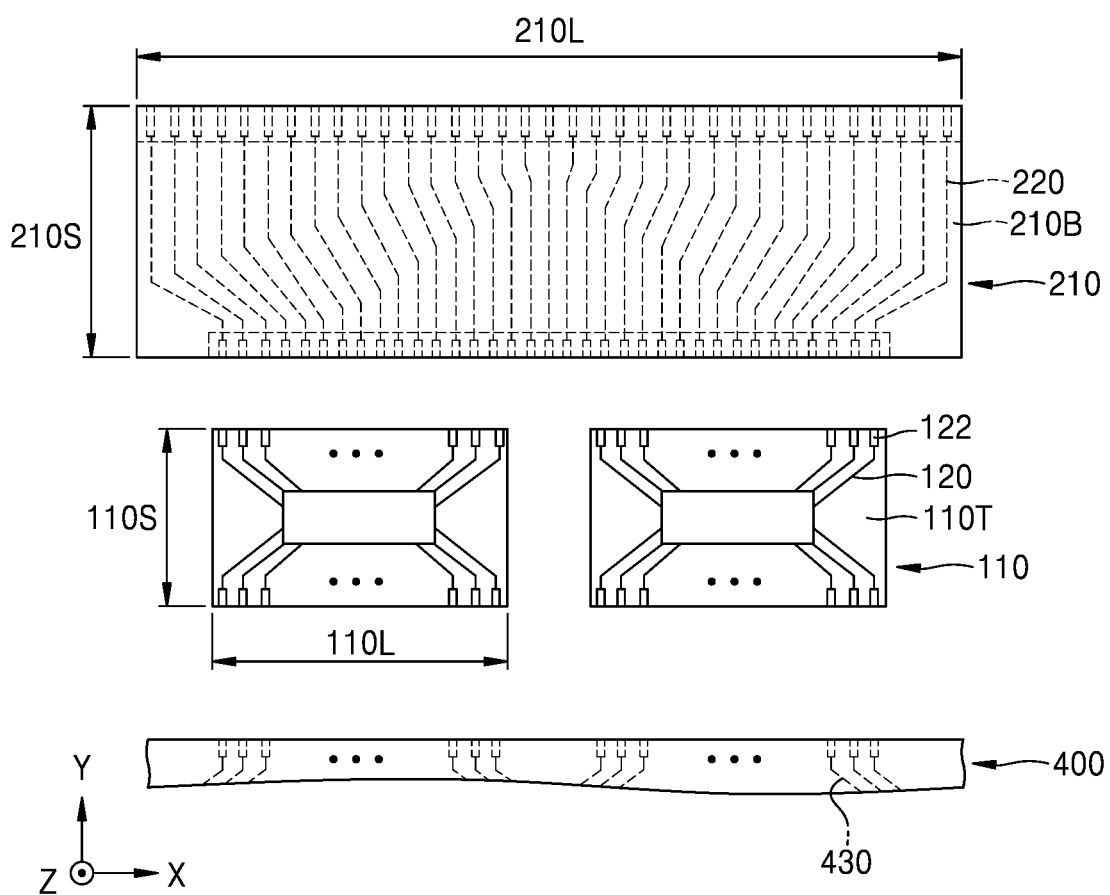
FIG. 4 is an exploded plan view of some components of the display apparatus of FIG. 1.

FIG. 1 is a plan view of a display apparatus 1000 according to an embodiment of the inventive concept, FIG. 2 is a side cross-sectional view of the display apparatus 1000 of FIG. 1, FIG. 3 is a perspective view of the display apparatus 1000 of FIG. 1, and FIG. 4 is an exploded plan view of some components of the display apparatus 1000 of FIG. 1.

Referring to FIGS. 1 through 4, the display apparatus 1000 may include at least one chip-on-film (COF) package 100, a driving printed circuit board 400, and a display panel 500.

The COF package 100 may be a package including a semiconductor chip 101 that is a display driver IC (DDI). According to some embodiments, one semiconductor chip 101 may be arranged in one COF package 100. According to other embodiments, a plurality of different types of semiconductor chips 101 may be arranged in one COF package 100. For example, the semiconductor chip 101 may include a source driver IC and/or a gate driver IC.

The COF package 100 may include a base film 110 and a bridge film 210 connected thereto. The bridge film 210 may include a bending area having a predetermined radius of curvature, and may include a flexible insulating material. The base film 110 may be in the shape of a substantially flat panel. A detailed description of the bridge film 210 will be given later.

The COF package 100 may be between the driving printed circuit board 400 and the display panel 500 and may be connected to the driving printed circuit board 400 and the display panel 500. In detail, the COF package 100 may receive a signal output by the driving printed circuit board 400 to the base film 110, and may transmit the signal to the display panel 500 via the bridge film 210.

One or more driving circuit chips 410, which may simultaneously or sequentially apply power and signals to the COF package 100, may be mounted on the driving printed circuit board 400. The COF package 100 may be electrically connected to driving connection lines 430 of the driving printed circuit board 400.

The display panel 500 may be, for example, a liquid crystal display (LCD) panel, a light emitting diode (LED) panel, an organic LED (OLED) panel, a plasma display panel (PDP), or the like.

According to some embodiments, a COF package 100, in which one base film 110 is coupled to one bridge film 210, may be connected between the driving printed circuit board 400 and the display panel 500. For example, when the display panel 500 is designed to provide a small screen such as a mobile phone or support a relatively low resolution, the display apparatus 1000 may include a COF package 100, in which one base film 110 is coupled to one bridge film 210.

According to other embodiments, a COF package 100, in which a plurality of base films 110 are included in one bridge film 210, may be connected between the driving printed circuit board 400 and the display panel 500. For example, when the display panel 500 is designed to provide a large screen such as a television or support a relatively high resolution, the display apparatus 1000 may include a COF package 100, in which a plurality of base films 110 are included in one bridge film 210.

The COF package 100 may be connected to only one side (e.g., a lower end) of the display panel 500. However, one or more embodiments are not limited thereto. According to some embodiment, one or more COF packages 100 may be connected to each of two or more sides of the display panel 500.

The display panel 500 may include a transparent substrate 510, an image area 520 formed on the transparent substrate 510, and panel connection lines 530. The transparent substrate 510 may be, for example, a glass substrate or a flexible substrate. Pixels arranged in the image area 520 may be connected to the panel connection lines 530 corresponding thereto and may be driven according to signals provided by the semiconductor chip 101 mounted on the COF package 100.

A short axis length 510D of a lower end of the display panel 500 according to an embodiment of the inventive concept, on which the panel connection lines 530 are arranged, may be less than that of a general large-area display panel. For example, the short axis length 510D of the lower end may be about 0.9 mm to about 1.5 mm, because connection lines (second conductive lines to be described later) that perform substantially the same function as the panel connection lines 530 are formed on the bridge film 210. The short axis length 510D may be the distance between a side of the image area 520 nearest to the bridge film 210 and a side of the transparent substrate 510 adjacent thereto. The side of the image area 520 nearest to the bridge film 210 and the side of the transparent substrate 510 adjacent thereto may be parallel to one another.

An input pad may be formed on one end of the COF package 100, and an output pad may be formed on the other end of the COF package 100. The input pad and the output pad may be respectively connected to the driving connection lines 430 of the driving printed circuit board 400 and the panel connection lines 530 of the display panel 500 by an anisotropic conductive layer 600. In detail, by using the anisotropic conductive layer 600, an edge of an upper surface of the base film 110 may be attached to the driving printed circuit board 400, another edge of the upper surface of the base film 110 may be attached to a lower surface of the bridge film 210, and the lower surface of the bridge film 210 may be attached to a front surface of the display panel 500. For example, the upper surface of the base film 110 and the lower surface of the bridge film 210 may be adhered to each other in their respective long axis directions. The bridge film 210 may be attached to the lower end of the display panel 500, and the short axis length 510D of the lower end of the display panel 500 to which the bridge film 210 is attached may be about 0.9 mm to about 1.5 mm as described above.

An anisotropic conductive layer 600 may be, for example, an anisotropic conductive film or an anisotropic conductive paste. The anisotropic conductive layer 600 may have a structure in which conductive particles disperse in an insulating adhesive layer. The anisotropic conductive layer 600 may have anisotropic electric features so that an electric current is allowed to flow only in an electrode direction (Z direction) during the connection and is insulated in a direction (X direction) between neighboring electrodes. When heat and pressure are applied to the anisotropic conductive layer 600 to melt an adhesive, the conductive particles may be arranged between opposing electrodes, for example, between the input pad and the driving connection lines 430 and between the output pad and the panel connection lines 530, and thus, the opposing electrodes may be conductive. On the contrary, an adhesive may fill a gap between neighboring electrodes, and thus, the neighboring electrodes may be insulated from each other.

In the display apparatus 1000, the display panel 500 may include a transparent substrate 510 and an image area 520 formed on the transparent substrate 510. Here, the COF package 100 attached to the display panel 500 includes the bridge film 210 forming a bending area having a predetermined radius of curvature, but one or more embodiments are not limited thereto.

The display panel 500 may include the transparent substrate 510 and the image area 520 including a plurality of pixels. The transparent substrate 510 may include front and rear surfaces that are opposite to each other, and the image area 520 may be arranged on the front surface of the transparent substrate 510. The COF package 100 may be bent to the front surface of the transparent substrate 510 and fixed thereto, and the driving printed circuit board 400 may face the rear surface of the transparent substrate 510.

A bezel 700 may form an exterior of the display apparatus 1000 and protect the COF package 100 and the driving printed circuit board 400. Because the display apparatus 1000 includes the bezel 700 having a small size and a panel having a small thickness, an area where the COF package 100 and the display panel 500 contact may also be reduced.

In general, a fan-out area for contacting the COF package 100 is present at the lower end of the display panel 500. Accordingly, the bezel 700 may be partially maintained to cover an area occupied by the fan-out area, and thus it is difficult to implement a bezel-less display apparatus 1000. Thus, the fan-out area may be referred to as a dead space of the display panel 500.

The display apparatus 1000 according to an embodiment of the inventive concept may separately include the bridge film 210 capable of playing a role of the fan-out area, and the bridge film 210 may be included in the COF package 100, and thus the dead space may be minimized.

Eventually, according to an embodiment of the inventive concept, the dead space of the display panel 500 may be efficiently improved using the bridge film 210 that couples the COF package 100 to the display panel 500, and consequently a display apparatus 1000 having a bezel-less effect may be realized.

Figure 5:
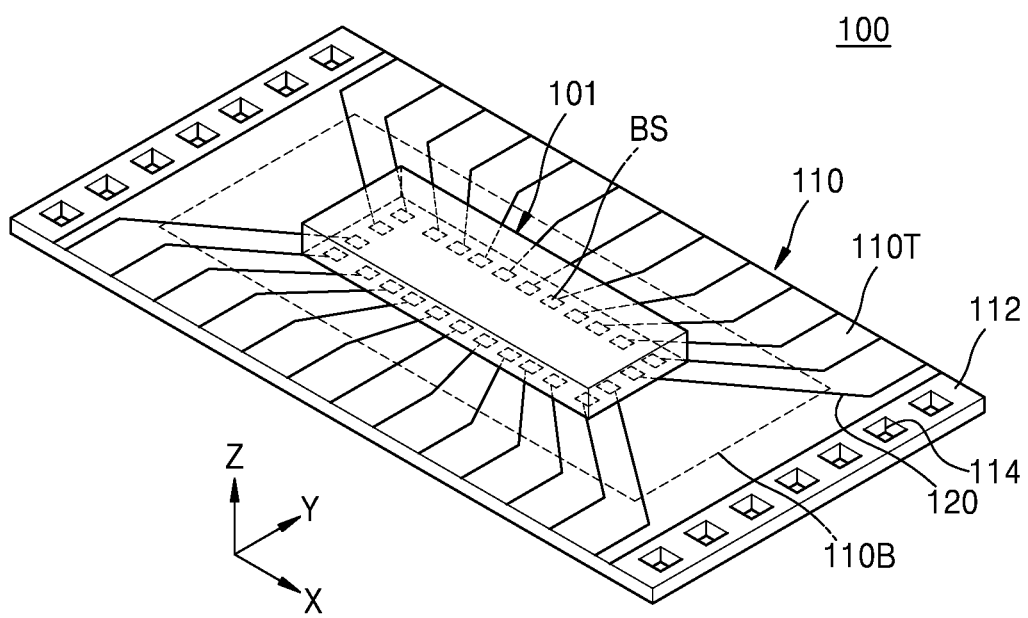
FIG. 5 is a perspective view of a portion of a chip on film (COF) package, according to an example embodiment of the inventive concept.
Figure 6:
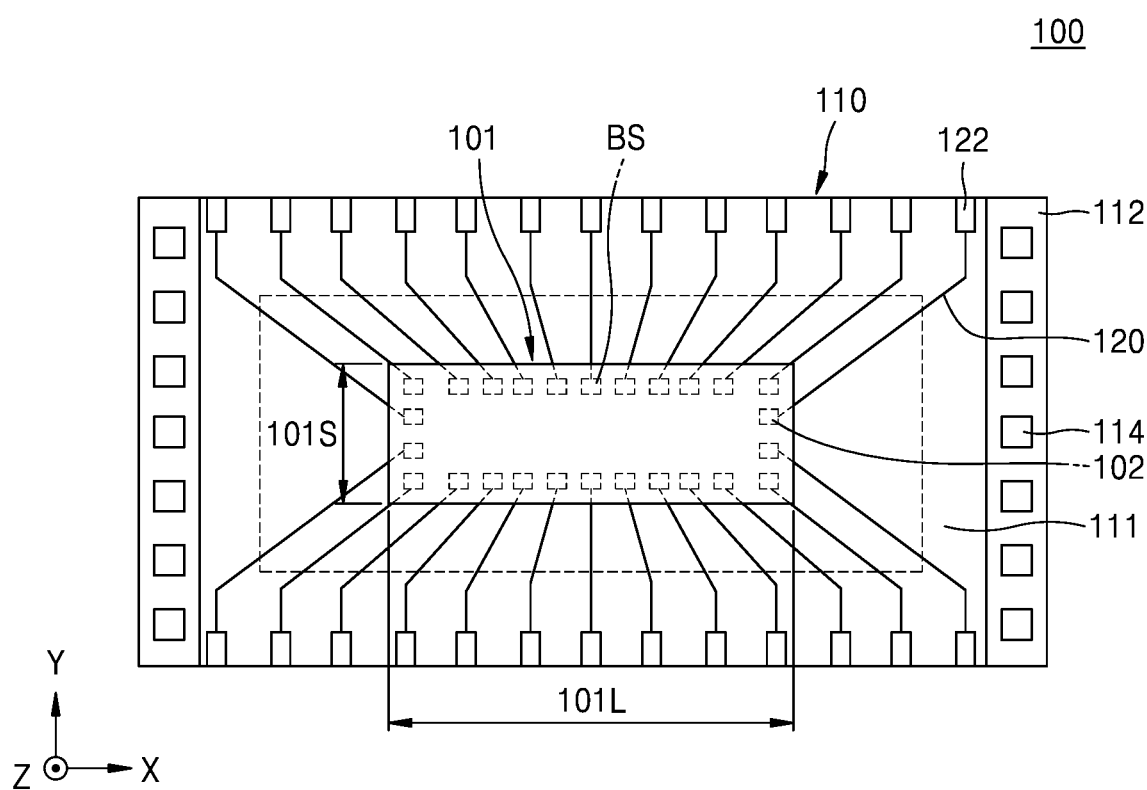
FIG. 6 is a plan view of the COF package of FIG. 5.
Figure 7:
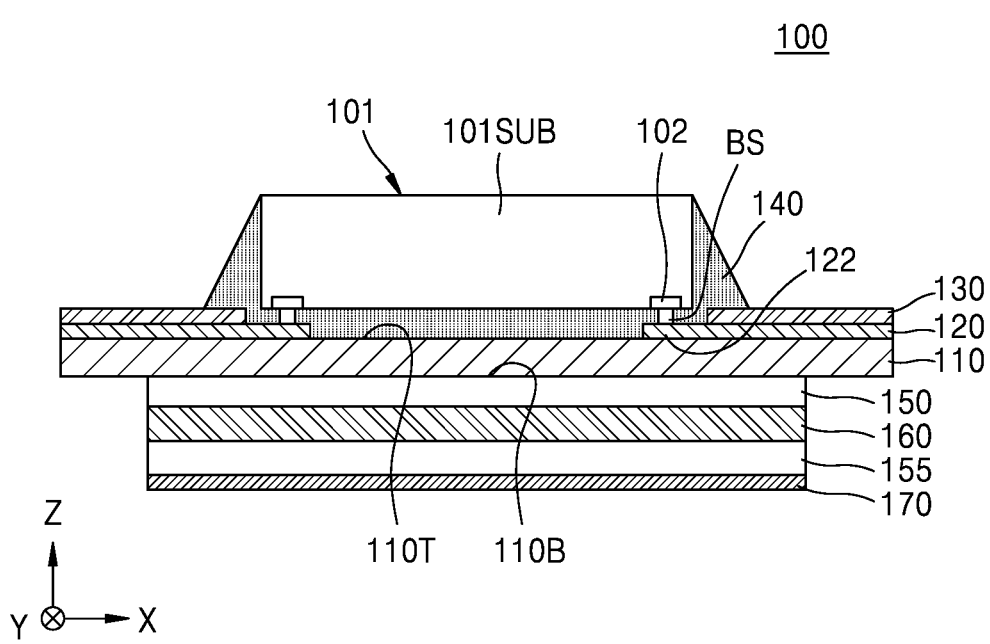
FIG. 7 is a side cross-sectional view of the COF package of FIG. 5 by cutting a circuit area of the COF package of FIG. 5.

FIG. 5 is a perspective view of a portion of the COF package 100 according to an example embodiment of the inventive concept, FIG. 6 is a plan view of the COF package 100 of FIG. 5, and FIG. 7 is a side cross-sectional view of the COF package 100 of FIG. 5 by cutting a circuit area of the COF package 100.

Referring to FIGS. 5 through 7, the COF package 100 of FIG. 1 may include, as some components, a semiconductor chip 101 and a base film 110.

The semiconductor chip 101 may be a DDI used to drive the display apparatus 1000 (see FIG. 1). For example, the semiconductor chip 101 may be a source driver chip configured to generate an image signal by using a data signal transmitted from a timing controller and output the image signal to the display panel 500 (see FIG. 1). Alternatively, the semiconductor chip 101 may be a gate driver chip configured to output, to the display panel 500 (see FIG. 1), scan signals including on/off signals of a transistor.

However, types of the semiconductor chip 101 are not limited thereto. For example, when the COF package 100 is coupled to another electronic apparatus, instead of the display apparatus 1000 (see FIG. 1), the semiconductor chip 101 may be a chip for driving the electronic apparatus.

For convenience of explanation, one semiconductor chip 101 is illustrated in the drawings, but the number of semiconductor chips 101 is not limited thereto. According to some embodiments, the number of source driver chips may be identical to or greater than the number of gate driver chips because of features of the display apparatus 1000 (see FIG. 1).

The semiconductor chip 101 may have a long side 101L in a first direction (X direction) and a short side 101S in a second direction (Y direction) perpendicular to the first direction (X direction). For example, the semiconductor chip 101 may have a rectangular shape. A length of the long side 101L may be about 1.5 times a length of the short side 101S. The semiconductor chip 101 may be designed to have the aforementioned shape to improve an arrangement of first conductive lines 120, which will be described later, and a degree of design freedom thereof.

The semiconductor chip 101 may include a substrate 101SUB and bump pads 102. The substrate 101SUB may be a semiconductor substrate, and thus may include an active surface and a non-active surface that are opposite to each other. In detail, the substrate 101SUB may be a silicon (Si) wafer including crystalline silicon, polycrystalline silicon, or amorphous silicon. Alternatively, the substrate 101SUB may include a semiconductor element, such as, Ge, or a compound semiconductor, such as, Si carbide (SiC), gallium arsenide (GaAs), indium arsenide (InAs), or indium phosphide (InP).

The substrate 101SUB may have a silicon-on-insulator (SOI) structure. According to some embodiments, the substrate 101SUB may include a conductive region, for example, an impurity-doped well or an impurity-doped structure. According to other embodiments, the substrate 101SUB may have any of various isolation structures, such as, for example, a shallow trench isolation (STI) structure.

The semiconductor chip 101 may be arranged in a circuit area 111 of the base film 110, particularly, in a chip mount area, and may be mounted on the base film 110 through a flip-chip bonding process. For example, bump structures BS, such as solder balls, may be arranged on the bump pads 102 exposed on the active surface of the semiconductor chip 101, and the bump structures BS may be physically and electrically coupled to a first conductive pad 122 of the base film 110. Thus, the semiconductor chip 101 may be mounted on the base film 110. Some of the bump pads 102 may function as input terminals, and the others of the bump pads 102 may function as output terminals.

The bump structures BS may respectively contact the bump pads 102 and the first conductive pads 122 and may electrically connect the bump pads 102 to the first conductive pads 122. Because of the bump structures BS, the semiconductor chip 101 may receive at least one of a control signal, a power signal, and a ground signal for driving the semiconductor chip 101 from the outside, receive from the outside a data signal that is to be stored in the semiconductor chip 101, or provide data stored in the semiconductor chip 101 to the outside. For example, each of the bump structures BS may have a pillar structure, a ball structure, or a solder layer structure.

The base film 110 may be a film including polyimide having a great coefficient of thermal expansion (CTE) and great durability. However, materials of the base film 110 are not limited thereto. The base film 110 may include, for example, synthetic resin such as epoxy-based resin, acrylic, polyether nitrile, polyether sulfone, polyethylene terephthalate, polyethylene naphthalate, or the like.

The base film 110 may include the circuit area 111 at the center of the base film 110, and perforation (PF) areas 112 that are arranged on both side ends of the circuit area 111. For example, the circuit area 111 may be interposed between two PF areas 112 in the first direction (X direction). The circuit area 111 may be an area where the semiconductor chip 101 is mounted.

The PF areas 112 may be arranged on both side ends of the base film 110 and may include a plurality of PF holes 114. Through the PF holes 114, reeling of the base film 110 by a winding reel (not shown) and releasing of the base film 110 from the winding reel may be controlled.

Because pitches of the PF holes 114 are uniform, a length of the base film 110 may be determined according to the number of PF holes 114. A width and the length of the base film 110 may be determined according to the number and sizes of semiconductor chips 101 mounted on the base film 110, an arrangement of the first conductive lines 120 formed on the base film 110, and the like. The width and the length of the base film 110 may be determined according to a relationship with the bridge film 210.

The PF areas 112 may be cut off before the COF package 100 is arranged in the display apparatus 1000 (see, e.g., FIG. 4). For example, in the COF package 100, only the circuit area 111 of the base film 110 may be arranged in the display apparatus 1000.

The first conductive lines 120 may be arranged on an upper surface 110T of the base film 110. The first conductive lines 120 may include the first conductive pads 122 on respective ends of the first conductive lines 120. The first conductive lines 120 may include, for example, aluminum foil or copper foil. According to some embodiments, the first conductive lines 120 may be formed by patterning a metal layer formed on the base film 110, through a process such as casting, laminating, or electro-plating.

Each of the first conductive pads 122 may be a portion of each of the first conductive lines 120 or a portion of each of the first conductive lines 120 plated with tin (Sn), gold (Au), nickel (Ni), lead (Pb), or the like. According to some embodiments, the first conductive pads 122 may be electrically connected to the first conductive lines 120 and may include a conductive material that is separately formed. The first conductive pads 122 may face the bump pads 102 of the semiconductor chip 101 and may be electrically connected to the bump pads 102.

A first protective layer 130 may be formed on the upper surface 110T of the base film 110 to protect the first conductive lines 120 from external physical and/or chemical damage. The first protective layer 130 may cover the first conductive lines 120 and expose the first conductive pads 122 of the first conductive lines 120 formed on the upper surface 110T of the base film 110.

The first protective layer 130 may be formed of, for example, solder resist or dry film resist. However, one or more embodiments are not limited thereto. The first protective layer 130 may be formed as an insulating layer based on silicon oxide or silicon nitride. According to some embodiments, the first protective layer 130 may have a different color from the second protective layer 230, which will be described later. For example, the first protective layer 130 may have a greenish color.

An underfill 140 may be filled between the semiconductor chip 101 and the base film 110 to protect the bump structures BS and the surroundings of the bump structures BS from external physical and/or chemical damage. According to some embodiments, the underfill 140 may be formed through a capillary underfill process. The underfill 140 may include, for example, epoxy resin, but embodiments are not limited thereto.

An adhesive layer 150 may be arranged on a lower surface 110B of the base film 110. For example, the adhesive layer 150 may contact the lower surface 110B of the base film 110. The adhesive layer 150 may be classified into inorganic adhesives and polymer adhesives. The polymer adhesives may be mainly classified into thermosetting resin and thermoplastic resin. The thermosetting resin has a three-dimensional (3D) cross-link structure after monomer is heated and molded, and does not soften even when being heated again. In contrast, the thermoplastic resin represents plasticity via heating, and thus has a linear polymer structure. According to some embodiments, the adhesive layer 150 may have a tape shape, but embodiments are not limited thereto.

A heat dissipation member 160 may be arranged on a lower surface of the adhesive layer 150. For example, the heat dissipation member 160 may contact the lower surface of the adhesive layer 150. The heat dissipation member 160 may be arranged on the lower surface 110B of the base film 110 to correspond to the semiconductor chip 101, and may dissipate heat emitted from the semiconductor chip 101. Therefore, for effective heat dissipation, a length of the heat dissipation member 160 in the first direction (X direction) may be greater than that of the long side 101L of the semiconductor chip 101, and a length of the heat dissipation member 160 in the second direction (Y direction) may be greater than that of the short side 101S of the semiconductor chip 101.

According to some embodiments, the heat dissipation member 160 may be in the form of a tape including metal. The metal may be, for example, aluminum (Al), copper (Cu), tungsten (W), or the like, but embodiments are not limited thereto. According to other embodiments, the heat dissipation member 160 may include epoxy, acrylic, silicon, or the like, and the resin may include a thermally conductive filler to obtain a good heat dissipation effect. The thermally conductive filler may include alumina ($Al_2O_3$), boron nitride (BN), aluminum nitride (AlN), or diamond. The heat dissipation member 160 may include a curable material. For example, the heat dissipation member 160 may include resin on which thermal curing, room-temperature curing, or UV curing may be performed.

A cover film 170 may be formed on a lower surface of the heat dissipation member 160 to protect the heat dissipation member 160 from external physical and/or chemical damage. The cover film 170 may be arranged to completely cover the heat dissipation member 160. For example, the cover film 170 may have a length in the first direction (X direction) that is the same as or greater than that of the heat dissipation member 160 and a length in the second direction (Y direction) that is the same as or greater than that of the heat dissipation member 160. The cover film 170 may include, for example, synthetic resin such as epoxy-based resin, acrylic, polyether nitrile, polyether sulfone, polyethylene terephthalate, polyethylene naphthalate, or the like. A cover adhesive layer 155 may be arranged between the heat dissipation member 160 and the cover film 170. For example, the cover adhesive layer 155 may contact the heat dissipation member 160, and the cover film 170 may contact the cover adhesive layer 155. The cover adhesive layer 155 may include substantially the same material as the adhesive layer 150. The cover adhesive layer 155 may have an adhesive tape shape, but embodiments are not limited thereto.

Figure 8:
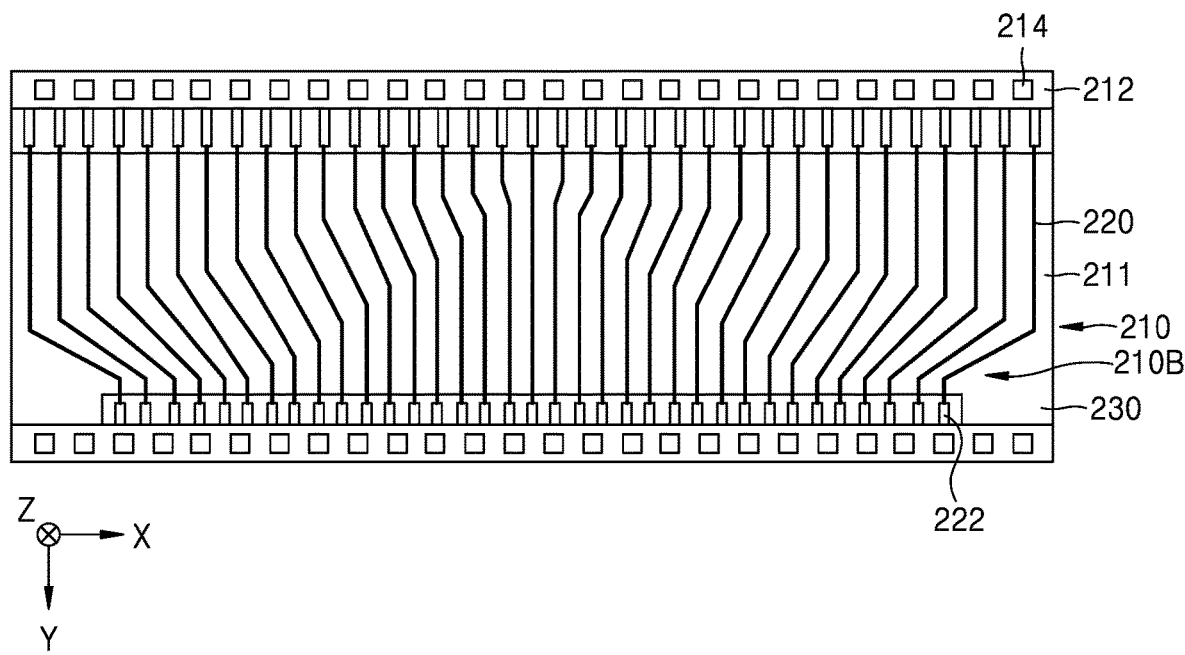
FIG. 8 is a plan view of another portion of a COF package, according to an example embodiment of the inventive concept.

FIG. 8 is a plan view of another portion of the COF package 100 according to an embodiment of the inventive concept.

Referring to FIG. 8, the COF package 100 of FIG. 1 may include, as another component, a bridge film 210.

The bridge film 210 may be a film including polyimide having a good thermal expansion coefficient and great durability, substantially the same as the base film 110. The bridge film 210 may be flexible. For example, the bridge film 210 may be a film including polyimide having a great coefficient of thermal expansion (CTE) and great durability. However, the material of the bridge film 210 is not limited thereto, and the bridge film 210 may include, for example, synthetic resin such as epoxy-based resin, acrylic, polyether nitrile, polyether sulfone, polyethylene terephthalate, polyethylene naphthalate, or the like.

The bridge film 210 may include a wiring area 211 at the center of the bridge film 210, and PF areas 212 that are arranged on both side ends of the wiring area 211. For example, the wiring area 211 may be interposed between two PF areas 212 in the second direction (Y direction). The PF areas 212 may be arranged on both side ends of the bridge film 210 and may include a plurality of PF holes 214. Through the PF holes 214, reeling of the bridge film 210 by a winding reel (not shown) and releasing of the bridge film 210 from the winding reel may be controlled.

Because pitches of the PF holes 214 are uniform, a length of the bridge film 210 may be determined according to the number of PF holes 214. A width and the length of the bridge film 210 may be determined according to the number and sizes of base films 110 mounted on the bridge film 210, an arrangement of second conductive lines 220 formed on the bridge film 210, and the like.

According to some embodiments, the bridge film 210 and the base film 110 may be manufactured using the same equipment by designing the pitches of the PF holes 214 of the bridge film 210 and the pitches of the PF holes 114 of the base film 110 to be substantially equal to each other. Terms such as "same" and "equal," as used herein, encompass near identicality including variations that may occur, for example, due to manufacturing processes. The term "substantially" may be used herein to emphasize this meaning, unless the context or other statements indicate otherwise.

The PF areas 212 may be cut off before the COF package 100 is arranged in the display apparatus 1000 (see, e.g., FIG. 4). For example, in the COF package 100, only the wiring area 211 of the bridge film 210 may be arranged in the display apparatus 1000.

The second conductive lines 220 may be arranged on a lower surface 210B of the bridge film 210. The second conductive lines 220 may include second conductive pads 222 on respective ends of the second conductive lines 220. The second conductive lines 220 may include, for example, aluminum foil or copper foil. According to some embodiments, the second conductive lines 220 may be formed by patterning a metal layer formed on the bridge film 210, through a process such as casting, laminating, or electroplating. The second conductive lines 220 may be formed radially in a direction away from an area where the first conductive lines 120 are arranged.

Each of the second conductive pads 222 may be a portion of each of the second conductive lines 220 or a portion of each of the second conductive lines 220 plated with tin (Sn), gold (Au), nickel (Ni), lead (Pb), or the like. According to some embodiments, the second conductive pads 222 may be electrically connected to the second conductive lines 220 and may include a conductive material that is separately formed. The second conductive pads 222 may overlap the first conductive pads 122 of the base film 110 and may be electrically connected to the first conductive pads 122 of the base film 110.

A second protective layer 230 may be formed on the lower surface 210B of the bridge film 210 to protect the second conductive lines 220 from external physical and/or chemical damage (see also FIG. 2). The second protective layer 230 may cover the second conductive lines 220 and expose the second conductive pads 222 of the second conductive lines 220 formed on the lower surface 210B of the bridge film 210. The second protective layer 230 may include, for example, a UV reactive polymer. However, one or more embodiments are not limited thereto. The second protective layer 230 may be formed as an insulating layer based on silicon oxide or silicon nitride. According to some embodiments, the second protective layer 230 may have a black color, because the second protective layer 230 having substantially the same color as the bezel 700 may maximize a bezel-less effect more. As described above, the first protective layer 130 may have a greenish color. Accordingly, the first protective layer 130 and the second protective layer 230 may have different colors.

A long axis length 210L of the bridge film 210 may be greater than the long axis length 110L of the base film 110 (see, e.g., FIG. 4). A short axis length 210S of the bridge film 210 may be greater than the short axis length 110S of the base film 110 (see, e.g., FIG. 4). The long axis length 210L of the bridge film 210 may be the length of the bridge film 210 in the first direction (X direction), and the short axis length 210S of the bridge film 210 may be the length of the bridge film 210 in the second direction (Y direction). The long axis length 110L of the base film 110 may be the length of the base film 110 in the first direction (X direction), and the short axis length 110S of the base film 110 may be the length of the base film 110 in the second direction (Y direction). According to some embodiments, a plurality of base films 110 of FIG. 6 may be attached to one bridge film 210. In this case, the long axis length 210L of the bridge film 210 may be twice or more the long axis length 110L (see, e.g., FIG. 4) of the base film 110 (see, e.g., FIG. 4). A short axis length 210S of the bridge film 210 may be, but is not limited to, about 35 mm to about 156 mm by taking into account a bending area. The upper surface of the base film 110 may be adhered to the lower surface of the bridge film 210 in their respective long axis directions.

According to some embodiments, a first width in the first direction (X direction) of each of the first conductive lines 120 of the base film 110 may be less than a second width in the first direction (X direction) of each of the second conductive lines 220 of the bridge film 210. For example, a line and a space interval in the first direction (X direction) of the first conductive lines 120 may be less than that of the second conductive lines 220. Accordingly, the area of the bridge film 210 is relatively wider in the first direction (X direction) than that of the base film 110, and thus, the sizes, an arrangement, and a design freedom of the second conductive lines 220 may be further increased.

Figure 9:
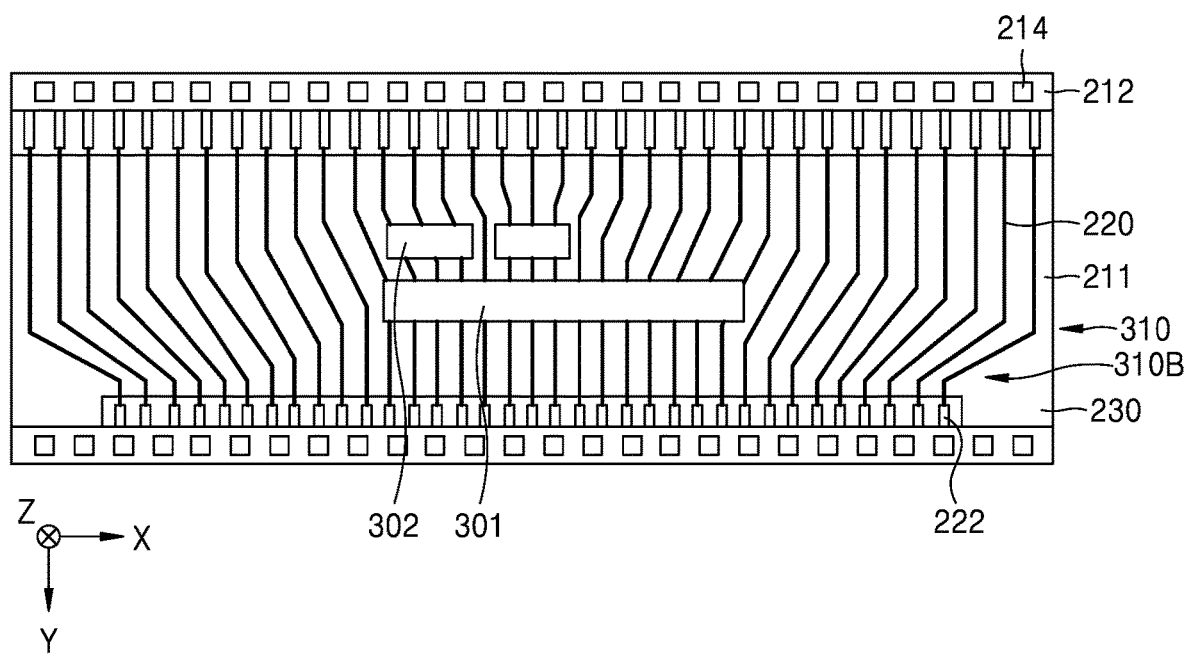
FIG. 9 is a plan view of another portion of a COF package, according to another example embodiment of the inventive concept.

FIG. 9 is a plan view of another portion of the COF package 100 according to another example embodiment of the inventive concept.

Most of the components constituting a bridge film 310 to be described below and materials used to form the components are substantially the same as those described above with reference to FIG. 8. Accordingly, for convenience of explanation, differences between the bridge film 310 and the bridge film 210 described above are mainly described.

Referring to FIG. 9, the COF package 100 of FIG. 1 may include, as other components, a bridge film 310. The bridge film 310 may be a film including polyimide having a great coefficient of thermal expansion (CTE) and great durability. However, the material of the bridge film 310 is not limited thereto, and the bridge film 310 may include, for example, synthetic resin such as epoxy-based resin, acrylic, polyether nitrile, polyether sulfone, polyethylene terephthalate, polyethylene naphthalate, or the like. The bridge film 310 may include the wiring area 211 at the center of the bridge film 310, PF areas 212 that are arranged on both side ends of the wiring area 211. The PF areas 212 may include a plurality of PF holes 214. An arrangement of second conductive lines 220 may be formed on the bridge film 310, and a second protective layer 230 may be formed on the lower surface 310B to protect the second conductive lines 220 from external physical and/or chemical damage. The second protective layer 230 may cover the second conductive lines 220 and expose the second conductive pads 222 of the second conductive lines 220 formed on the lower surface 310B of the bridge film 310. The second conductive lines 220 may include second conductive pads 222 on respective ends of the second conductive lines 220. An edge of the upper surface of the base film 110 may be attached to the lower surface 310B of the bridge film 310, and the lower surface 310B of the bridge film 310 may be attached to a front surface of the display panel 500.

The bridge film 310 may further include a passive element 301 and a logic element 302. The passive element 301 and the logic element 302 may be arranged on the lower surface 310B of the bridge film 310. Alternatively, only the passive element 301 may be arranged on the lower surface 310B of the bridge film 310, or only the logic element 302 may be arranged on the lower surface 310B of the bridge film 310. The numbers of passive elements 301 and logic elements 302 arranged on the lower surface 310B of the bridge film 310 are not limited to the numbers shown in FIG. 9. The second conductive lines 220 and the second protective layer 230 may be interposed between the lower surface 310B of the bridge film 310 and the passive element 301 and/or the logic element 302. For example, the passive element 301 and/or the logic element 302 may be formed on and may contact the second protective layer 230.

According to some embodiments, the passive element 301 may monitor a current amount. For example, the passive element 301 may perform a function such as COF Current Monitoring (CCM), COF Temperature Monitoring (CTM), Data line Current Monitoring (DCM), or Sensing line Current Monitoring (SCM). However, embodiments are not limited thereto.

According to some embodiments, the logic element 302 may perform programming to control a current amount through a logical operation function, but embodiments are not limited thereto.

The use of the passive element 301 and the logic element 302 may prevent an overcurrent from being input to the display panel 500 of FIG. 1, thereby efficiently controlling a burning issue of the display panel 500 of FIG. 1.

Figure 10:
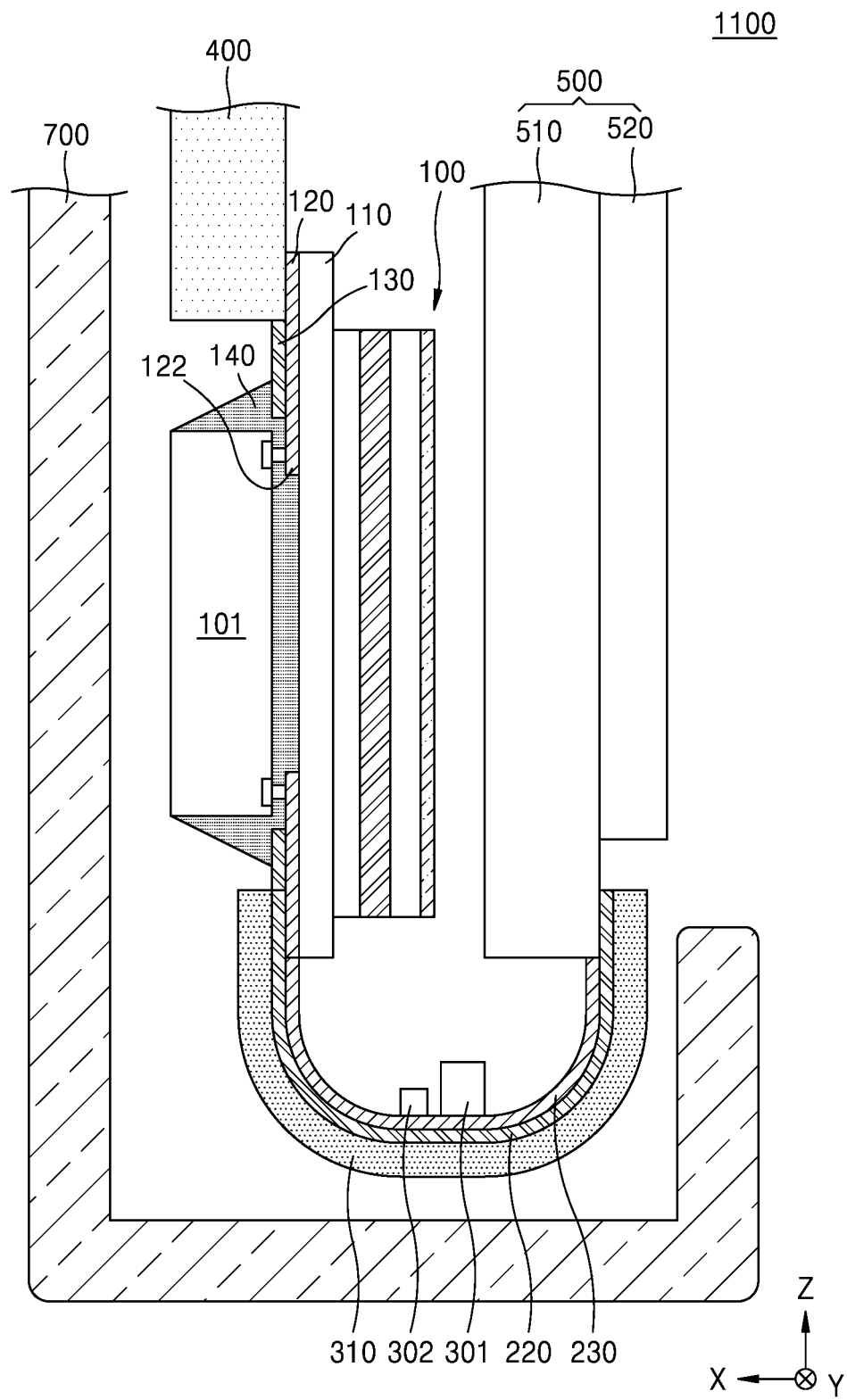
FIG. 10 is a side cross-sectional view of a display apparatus, according to another example embodiment of the inventive concept.

FIG. 10 is a side cross-sectional view of a display apparatus according to another example embodiment of the inventive concept.

Most of the components constituting a display apparatus 1100 to be described below and materials used to form the components are substantially the same as those described above with reference to FIGS. 1 through 4. Accordingly, for convenience of explanation, differences between the display apparatus 1100 and the display apparatus 1000 described above are mainly described.

Referring to FIG. 10, the display apparatus 1100 may include the COF package 100, the driving printed circuit board 400, the display panel 500, and the bezel 700.

In the display apparatus 1100, the display panel 500 may include the transparent substrate 510 and the image area 520 formed on the transparent substrate 510. Here, the COF package 100 includes the bridge film 310 having the passive element 301 and the logic element 302 and forming a bending area having a predetermined radius of curvature, but one or more embodiments are not limited thereto.

The display panel 500 may include the transparent substrate 510 and the image area 520 including a plurality of pixels. The transparent substrate 510 may include front and rear surfaces that are opposite to one other, and the image area 520 may be arranged on the front surface of the transparent substrate 510. The COF package 100 may be bent to the front surface of the transparent substrate 510 and fixed thereto, and the driving printed circuit board 400 may face the rear surface of the transparent substrate 510. The bezel 700 may form an exterior of the display apparatus 1100 and protect the COF package 100 and the driving printed circuit board 400.

While the inventive concept has been particularly shown and described with reference to embodiments thereof, it will be understood that various changes in form and details may be made therein without departing from the spirit and scope of the following claims.

What is claimed is:

1. A chip on film (COF) package comprising:
   a base film having an upper surface and a lower surface opposite to each other;
   a bridge film having an edge that overlaps the base film, and an upper surface and a lower surface opposite to each other;
   a display driver integrated circuit (IC) mounted on the upper surface of the base film; and
   a heat dissipation member arranged in correspondence with the display driver IC on the lower surface of the base film,
   wherein the upper surface of the base film and the lower surface of the bridge film adhere to each other in their respective longest axis directions,
   wherein a longest axis length of the bridge film is greater than a longest axis length of the base film, and
   wherein a first width of each first conduct line arranged on the upper surface of the base film is less than a second width of each second conductive line arranged on the lower surface of the bridge film.

2. The COF package of claim 1, wherein a plurality of base films are attached to the bridge film.

3. The COF package of claim 1, wherein a short axis length of the bridge film is about 35 mm to about 156 mm.

4. The COF package of claim 1,
   wherein, in the base film, a first protective layer covering the first conductive line includes solder resist or dry film resist, and
   wherein in the bridge film, a second protective layer covering the second conductive line includes UV reactive polyimide.

5. The COF package of claim 4, wherein the first protective layer is a first color and the second protective layer is a second color different from the first color.

6. The COF package of claim 1, wherein at least one of a passive element and a logic element are arranged on the lower surface of the bridge film.

7. The COF package of claim 6, wherein the passive element monitors a current amount.

8. The COF package of claim 1, wherein the bridge film comprises a flexible insulating material.

9. The COF package of claim 1,
   wherein an attachment area of a driving printed circuit board is included on the upper surface of the base film, and
   wherein an attachment area of a display panel is included on the lower surface of the bridge film.

10. A chip on film (COF) package comprising:
    a base film having an upper surface and a lower surface opposite to each other; and
    a bridge film having an edge that overlaps the base film, and an upper surface and a lower surface opposite to each other,
    wherein the base film comprises:

a first conductive line arranged on the upper surface of the base film and having a first conductive pad;

a display driver integrated circuit (IC) mounted on the upper surface of the base film;

a first protective layer formed on the first conductive line and the upper surface of the base film so as to expose the first conductive pad;

an underfill filled between the display driver IC and the base film; and a heat dissipation member arranged in correspondence with the display driver IC on the lower surface of the base film, wherein the bridge film comprises a second conductive line arranged on the lower surface of the bridge film and having a second conductive pad; and a second protective layer formed on the second conductive line and the lower surface of the bridge film so as to expose the second conductive pad, wherein the first conductive pad contacts the second conductive pad, and wherein a plurality of base films are spaced apart from each other and adhere to the bridge film.

11. The COF package of claim 10, wherein the second conductive line is arranged radially in a direction away from the first conductive line.

12. The COF package of claim 10, wherein a line and space interval of the first conductive line is less than a line and space interval of the second conductive line.

13. The COF package of claim 10, wherein the first protective layer and the second protective layer comprise different materials from each other, and wherein the first protective layer and the second protective layer have different colors from each other.

14. The COF package of claim 10, wherein the base film is in the shape of a substantially flat panel, and wherein the bridge film comprises a bending area having a predetermined radius of curvature.

15. A display apparatus comprising:

a chip on film (COF) package;

a display panel to which the COF package is bent and fixed; and a driving printed circuit board that faces the display panel, wherein the COF package comprises:

a base film having an upper surface and a lower surface opposite to each other;

a bridge film including an edge that overlaps the base film, and an upper surface and a lower surface opposite to each other;

a display driver integrated circuit (IC) mounted on the upper surface of the base film; and a heat dissipation member arranged in correspondence with the display driver IC on the lower surface of the base film, wherein the upper surface of the base film and the lower surface of the bridge film adhere to each other in their respective longest axis directions, wherein a longest axis length of the bridge film is greater than a longest axis length of the base film, wherein the display panel has a front surface including a plurality of pixels and a rear surface opposite to the front surface, wherein the lower surface of the bridge film has a predetermined radius of curvature and is bent to and attached to the front surface of the display panel, wherein the lower surface of the base film flatly faces the rear surface of the display panel, and wherein the driving printed circuit board is arranged on the upper surface of the base film so as to face the rear surface of the display panel.

16. The display apparatus of claim 15, wherein a plurality of base films are spaced apart from each other and adhere to the bridge film, and wherein a short axis length of the bridge film is about 35 mm to about 156 mm.

17. The display apparatus of claim 15, wherein the bridge film is attached to a lower end of the display panel, and wherein a short axis length of an area where the bridge film is attached to the display panel is about 0.9 mm to about 1.5 mm.

18. The display apparatus of claim 15, wherein at least one of a passive element and a logic element are arranged on the lower surface of the bridge film to monitor a current amount.

* * * * *